(12) United States Patent
Tamlyn

(10) Patent No.: US 7,849,349 B2
(45) Date of Patent: Dec. 7, 2010

(54) REDUCED-DELAY CLOCKED LOGIC

(75) Inventor: Robert Tamlyn, Apex, NC (US)

(73) Assignee: Qimonda AG, München (DE)

( * ) Notice: Subject to any disclaimer, the term of this patent is extended or adjusted under 35 U.S.C. 154(b) by 918 days.

(21) Appl. No.: 11/692,245

(22) Filed: Mar. 28, 2007

(65) Prior Publication Data

US 2008/0238483 A1 Oct. 2, 2008

(51) Int. Cl.
*G06F 1/04* (2006.01)
(52) U.S. Cl. .................... 713/501; 713/600; 326/93
(58) Field of Classification Search ............... 713/500, 713/501, 600; 326/93
See application file for complete search history.

(56) References Cited

U.S. PATENT DOCUMENTS

| | | | | |
|---|---|---|---|---|
| 4,241,418 A | * | 12/1980 | Stanley ...................... | 713/501 |
| 5,250,858 A | | 10/1993 | Strong | |
| 5,598,112 A | * | 1/1997 | Phillips ...................... | 326/93 |
| 7,292,672 B2 | * | 11/2007 | Isono .......................... | 377/64 |

OTHER PUBLICATIONS

Forbes, Michael et al. "Finite State Engines." Course Paper for EE 7063 Computer Engineering, Department of Electrical Engineering, University of Tulsa, (available at http://www.personal.utulsa.edu/~jhl/fse.pdf).

* cited by examiner

*Primary Examiner*—Thuan N Du
(74) *Attorney, Agent, or Firm*—Coats & Bennett, P.L.L.C.

(57) ABSTRACT

Delay in a clocked logic circuit is reduced by partially determining a next state of the clocked logic circuit based on a current state of the clocked logic circuit during a first portion of a clock cycle. The partially determined next state of the clocked logic circuit is prevented from affecting the current state of the clocked logic circuit during the first portion of the clock cycle. The next state of the clocked logic circuit is completely determined based on a previous state of the clocked logic circuit and the partially determined next state of the clocked logic circuit during a second portion of the clock cycle.

22 Claims, 6 Drawing Sheets

REDUCED-DELAY CLOCKED LOGIC

BACKGROUND OF THE INVENTION

Clocked logic circuitry such as sequential circuits, state machines, data paths, counters, arithmetic logic units, processors, or the like use a clock signal to advance the circuitry from state to state. The current state of a clocked logic circuit is a function of its previous state, the previous state of other circuitry, or both. Circuit state may be advanced responsive to the rising edge of a clock signal, falling edge, or both. The input to clocked logic circuitry does not affect the present logic state when the clock signal is inactive (i.e., not rising and/or falling). Circuit operation should be completed within a fixed interval of time between two clock pulses, called a 'clock cycle', to ensure reliable operation of clocked logic circuitry. Otherwise, circuit behavior becomes unpredictable and may result in failure.

Performance of clocked logic circuitry is limited by the amount of time needed to process previous state information to produce next state information. Conventionally, previous state information is captured during a first portion of a clock cycle and processed during a second portion of the clock cycle to determine the next logic state. Combinatorial logic included in clocked logic circuitry has one or more critical paths that limit circuit performance. Critical paths are circuit paths that limit how fast a circuit operates, e.g., paths that take the most time to generate an output responsive to an input. In clocked logic circuits, critical paths yield state information the determination of which limits circuit performance. Unpredictable circuit behavior (and possibly failure) occurs when state information is not fully determined within a clock cycle. Accordingly, clock cycle duration is conventionally based on the amount of time needed by critical paths to generate state information before advancing clocked logic circuitry to a next state. Clocked logic circuit performance may be improved by generating performance-limiting state information earlier in a clock cycle.

SUMMARY OF THE INVENTION

According to the methods and apparatus taught herein, delay in a clocked logic circuit is reduced by partially determining a next state of the clocked logic circuit based on a current state of the clocked logic circuit during a first portion of a clock cycle. The partially determined next state of the clocked logic circuit is prevented from affecting the current state of the clocked logic circuit during the first portion of the clock cycle. The next state of the clocked logic circuit is completely determined based on a previous state of the clocked logic circuit and the partially determined next state of the clocked logic circuit during a second portion of the clock cycle.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
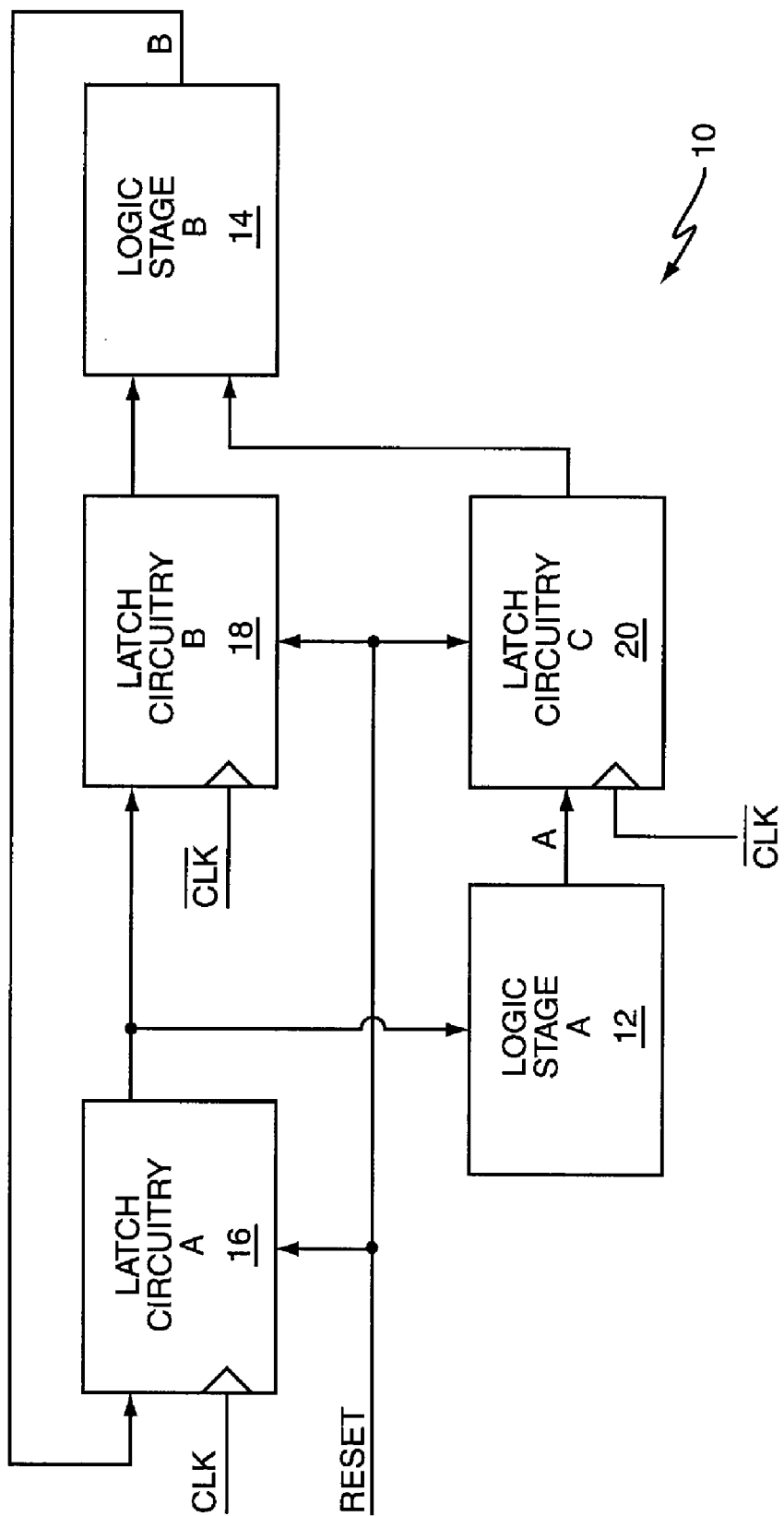
FIG. 1 is a block diagram of one embodiment of a multi-stage clocked logic circuit.

FIG. 1 illustrates an embodiment of a clocked logic circuit 10 such as a sequential circuit, state machine, data path, counter, arithmetic logic unit, processor, or the like. The clocked logic circuit 10 implements one or more functions and is segmented into at least two stages 12, 14. The circuit 10 advances from state-to-state responsive to transitions in a clock signal (CLK). A first logic stage 12 partially determines a next state of the circuit 10 based on current state information provided to the first stage 12 during a first portion of a clock cycle, e.g., when the clock signal is at a logic high level. The information processed by the first stage 12 may be the current state of the clocked logic circuit 10 (as shown in FIG. 1), the current state of other logic circuits (not shown) or both. Regardless, a second logic stage 14 completes determination of the next logic state based on the first stage results during a subsequent portion of the clock cycle, e.g., when the clock signal is at a logic low level. Performance of the clocked logic circuit 10 is improved by partially determining the next state of the logic circuit 10 during the first portion of a clock cycle and completing determination of the next logic state during the subsequent portion of the same clock cycle.

Partial state information generated by the first stage 12 may be timing-critical in that its generation would limit circuit performance if not generated early in a clock cycle by the first logic stage 12. By segmenting the clocked logic circuit 10 into at least two stages 12, 14, one or more critical paths may be placed in the first logic stage 12. The first stage 12 generates timing-critical state information early in a clock cycle. The second logic stage 14 subsequently processes the timing-critical state information and other state information to determine the next state of the clocked logic circuit 10. Circuit performance is improved because the timing-critical state information is generated early in the clock cycle, thus alleviating critical performance constraints.

The clocked logic circuit 10 further includes latch circuitry 16, 18, 20 for ensuring proper operation. First latch circuitry 16 captures the current state of the clocked logic circuit 10 during the first portion of a clock cycle and provides the information to the first logic stage 12 for processing. The first latch circuitry 16 may be positive-edge triggered, negative-edge triggered or level-sensitive. Regardless, the first latch circuitry 16 also prevents next state information, e.g., as generated by the second logic stage 14 from affecting operation of the first logic stage 12 during the second portion of a clock cycle.

Second latch circuitry 18 passes state information captured by the first latch circuitry 16 to the second logic stage 14 for processing during the second portion of a clock cycle. Third latch circuitry 20 passes partial state information generated by the first logic stage 12 to the second logic stage 14 also for processing during the second portion of the clock cycle. The second and third latch circuitry 18, 20 may also be positive-edge triggered, negative-edge triggered or level-sensitive. Regardless, the second and third latch circuitry 18, 20 prevent the first latch circuitry 16 and the first logic stage 12, respectively, from affecting operation of the second logic stage 14 during the first portion of a clock cycle. This way, the second logic stage 14 is isolated from the first latch circuitry 16 by the second latch circuitry 18 and from the first logic stage 12 by the third latch circuitry 20. Likewise, the first logic stage 12 is isolated from the second logic stage 14 (or other circuitry) by the first latch circuitry 16.

Operation of the clocked logic circuit 10 is described next in more detail with reference to Table 1 below. A reset signal (RESET) provided to the circuit 10 places the latch circuitry 16, 18, 20 in known initialized states. The output of the first latch circuitry 16 passes through the first logic stage 12 becoming A(RESET). A(RESET) is provided to the input of the third latch circuitry 20 (Latch C in Table 1). Likewise, the output of the second and third latch circuitry 18, 20 passes through the second logic stage 14 becoming B(RESET). B(RESET) is provided to the input of the first latch circuitry 16 (Latch A in Table 1).

Figure 2:
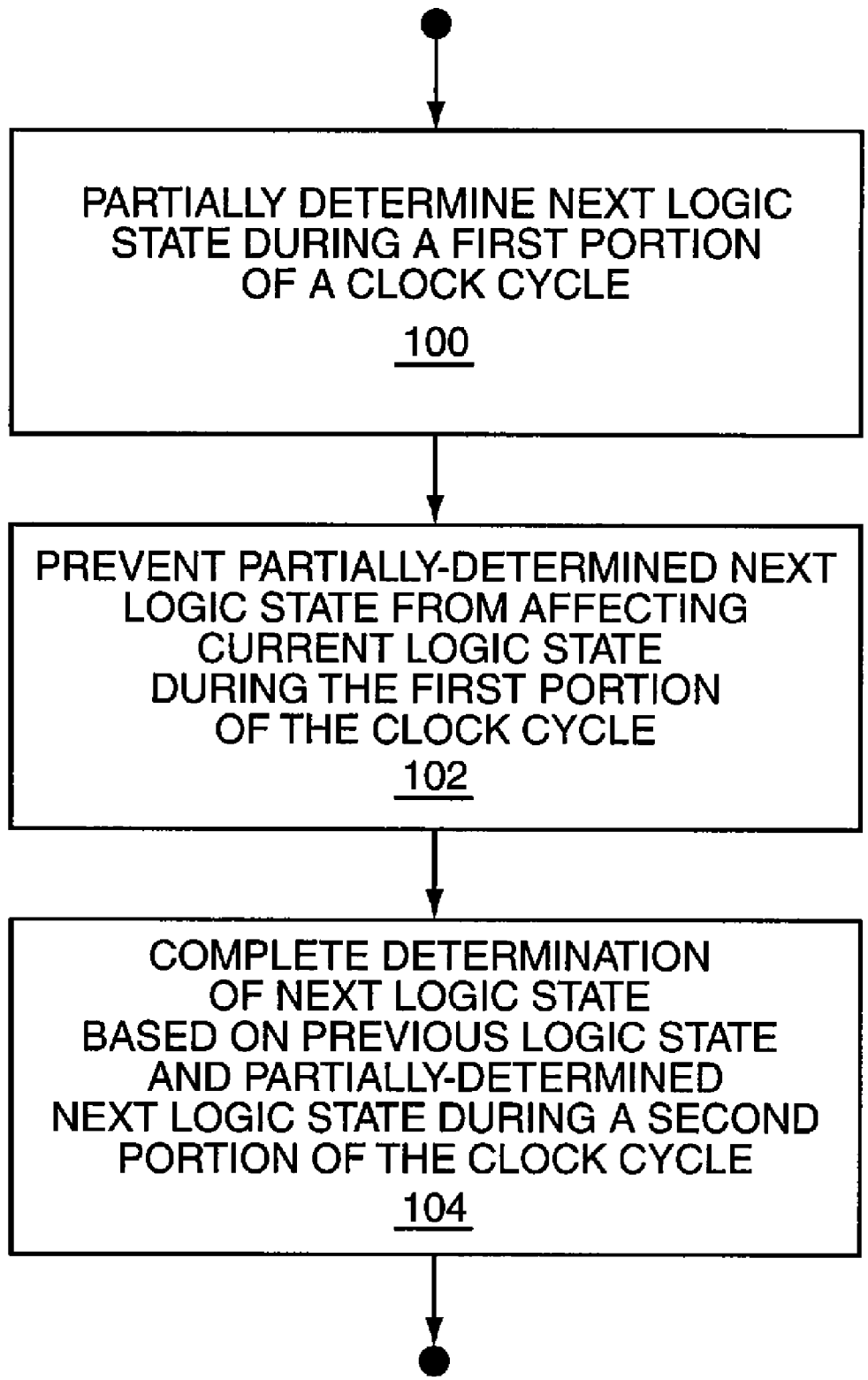
FIG. 2 is a logic flow diagram of an embodiment of program logic for reducing delay in a multi-stage clocked logic circuit.

The clock signal transitions to a logic high value following reset. In response to the positive clock transition, the first latch circuitry 16 captures or latches the initial state B(RESET) of the clocked logic circuit 10 as output by the second logic stage 14. The first latch circuitry 16 provides the captured circuit state to the first logic stage 12. The first logic stage 12 partially determines the next logic state A(X) based on the initial logic state captured by the first latch circuitry 16, e.g., as illustrated by Step 100 of FIG. 2. At this point in time, the second latch circuitry 18 (Latch B in Table 1) is unaffected by the newly captured state information B(RESET) and the third latch circuitry 20 is unaffected by the partially-determined next state information A(X). As such, the second latch circuitry 18 prevents the first latch circuitry 16 from affecting operation of the second logic stage 14. Likewise, the third latch circuitry 20 prevents the partially-determined next state A(X) from affecting operation of the second logic stage 14, e.g., as illustrated by Step 102 of FIG. 2. Accordingly, the outputs of the second and third latch circuitry 18, 20 remain in their reset state (RESET).

The clock signal then transitions to a logic low value during the same clock cycle. In response to the negative clock transition, the second and third latch circuitry 18, 20 captures the state information present at their respective inputs. That is, the second latch circuitry 18 captures the state information B(RESET) held by the first latch circuitry 14. The third latch circuitry 20 captures the partially-determined next state information A(X) generated by the first logic stage 12. The second logic stage 14 then fully determines the next logic state of the clocked logic circuit 10 based on the state information captured by the second and third latch circuitry 18, 20, e.g., as illustrated by Step 104 of FIG. 2. Further, the first latch circuitry 16 prevents the newly-generated state information from affecting operation of the second logic stage 14 during the second portion of the clock cycle.

Figure 3:
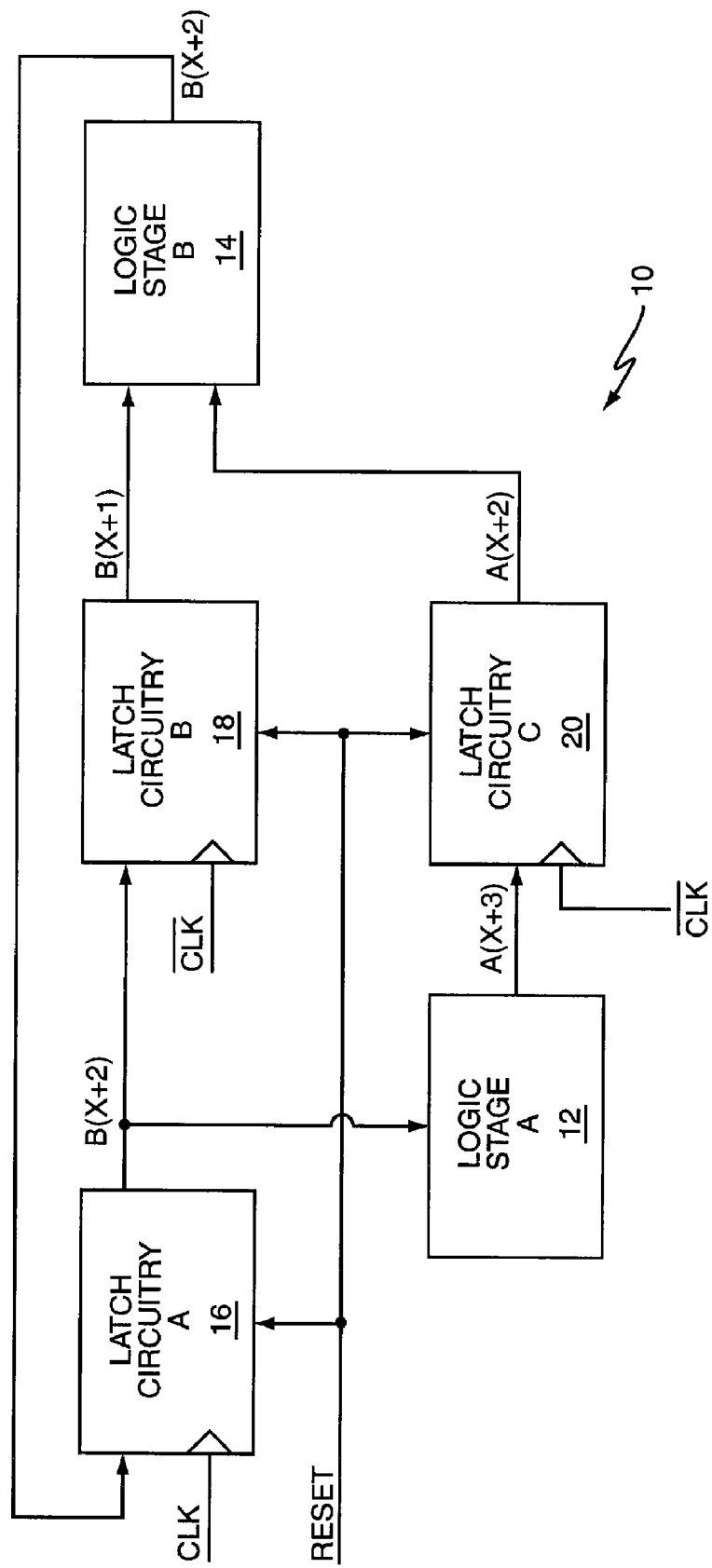
FIG. 3 is a block diagram of one embodiment of the multi-stage clocked logic circuit of FIG. 1 showing the logic state of the circuit during a first portion of a clock cycle.
Figure 4:
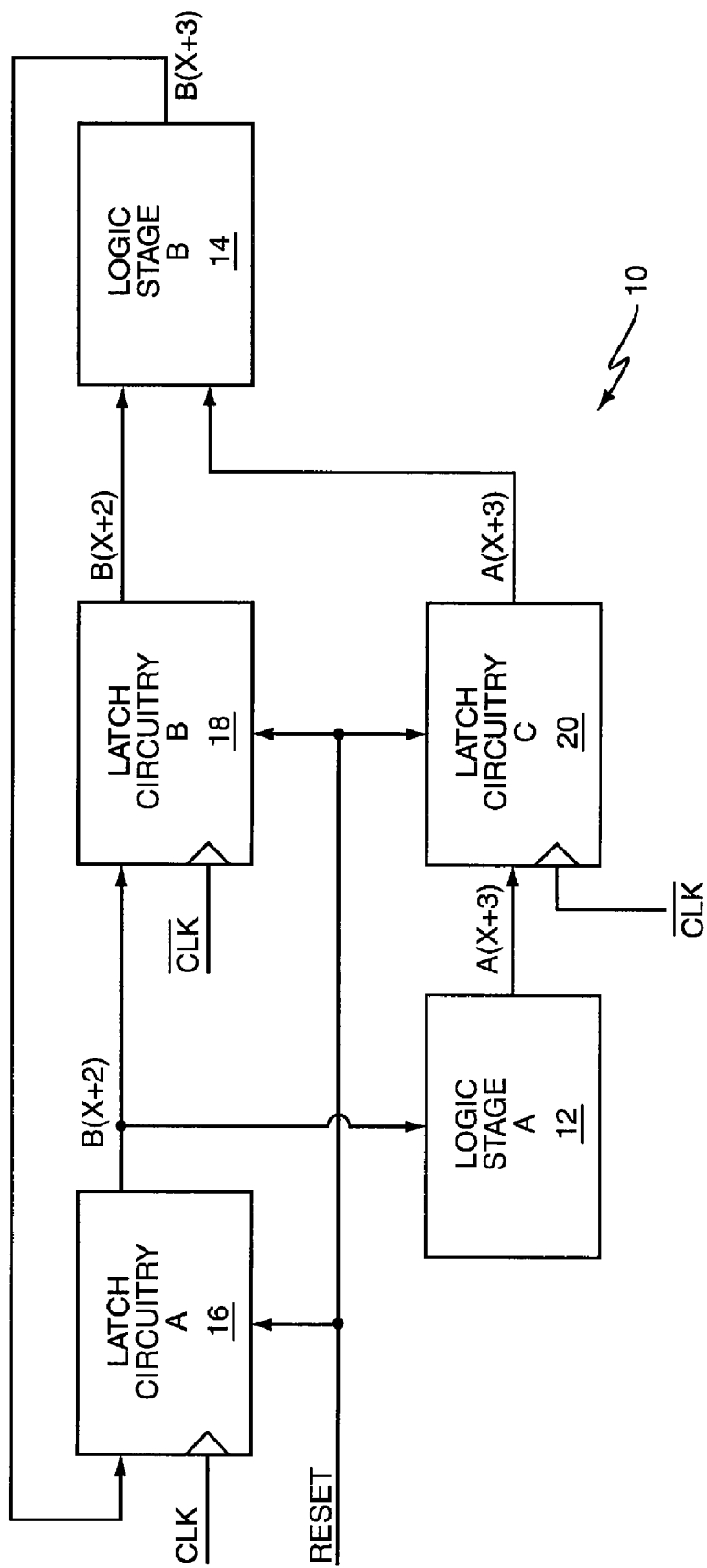
FIG. 4 is a block diagram of another embodiment of the multi-stage clocked logic circuit of FIG. 1 showing the logic state of the circuit during a second portion of the clock cycle.

Subsequent clock cycles cause the clocked logic circuit 10 to transition from state-to-state based on partially-determined next state information and previous state information. FIGS. 3 and 4 illustrate the clocked logic circuit 10 of FIG. 1 as the circuit 10 transitions from a current state of B(X+2) to a next state of B(X+3) during the fourth clock cycle shown in Table 1. During the first portion of the fourth clock cycle, the first latch circuitry 16 captures the current state B(X+2) of the clocked logic circuit 10 output by the second logic stage 14 as shown in FIG. 3. The first logic stage 12 partially determines the next logic state A(X+3) based on the state information captured by the first latch circuitry 16. The second and third latch circuits 18, 20 are unaffected by the first latch circuitry 16 and the first logic stage 12, respectively. As such, the output of the second latch circuitry 18 remains at the previous logic state B(X+1) while the output of the third latch circuitry 20 remains at the previously determined partial next state A(X+2).

During the second portion of the fourth clock cycle, the second logic stage 14 completes calculation of the next logic state B(X+3) as shown in FIG. 4. To this end, the second latch circuitry 18 captures the state information B(X+2) held by the first latch circuitry 16. The third latch circuitry 20 captures the partially-determined next state information A(X+3) generated by the first logic stage 12. The second logic stage 14 determines the next logic state B(X+3) based on the previous state information B(X+2) and the partially-determined next state A(X+3). The first latch circuitry 16 prevents the next logic state B(X+3) from altering operation of the second logic stage 14. Accordingly, the first latch circuitry 16 maintains its current state information during the second portion of the fourth clock cycle, thus ensuring proper operation of the clocked logic circuit 10.

Figure 5:
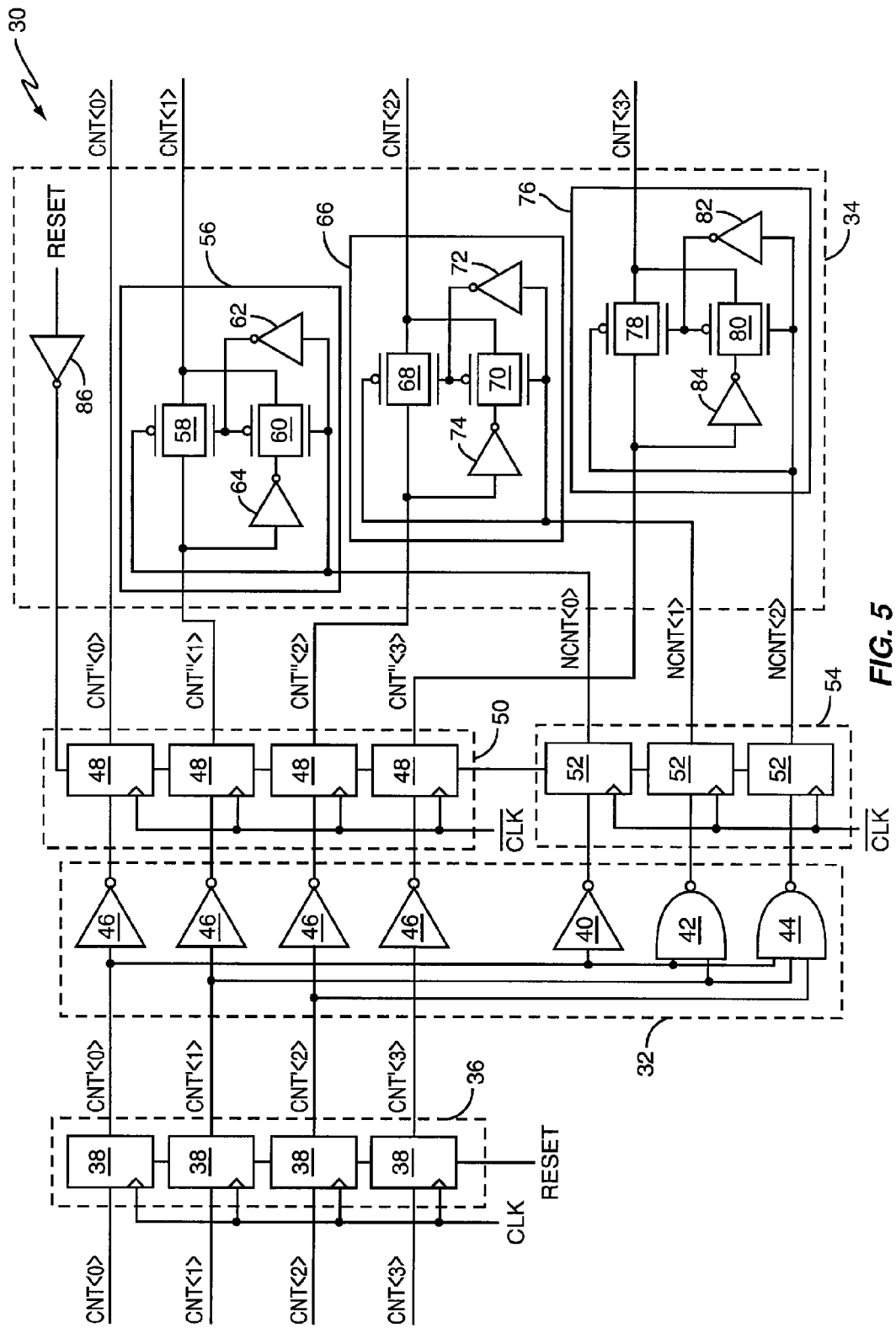
FIG. 5 is a block diagram of another embodiment of a multi-stage clocked logic circuit.

FIG. 5 illustrates another embodiment of a clocked logic circuit 30. According to this embodiment, the circuit 30 is a four-bit digital counter. The counter 30 has two logic stages 32, 34 for incrementing a four-bit count value CNT<3:0> responsive to transitions in a clock signal (CLK). The first logic stage 32 partially determines the next count value based on the current count value captured by first latch circuitry 36 during a first portion of a clock cycle. The second logic stage 34 fully computes the next count value based on the previously captured count value CNT'<3:0> and the partially determined count value NCNT<2:0> during a second portion of the clock cycle. Timing-critical processing is performed by the first logic stage 32 early on in each clock cycle, thus improving counter performance.

In more detail, the first logic stage 32 determines which bits of the count value should change value during a current clock cycle. During a first portion of the clock cycle, latches 38 included in the first latch circuitry 36 capture the current

TABLE 1

Multi-Stage Clocked Logic Circuit State Transitions

| Clock State | Latch A In | Latch A Out | Latch B In | Latch B Out | Latch C In | Latch C Out |
|---|---|---|---|---|---|---|
| RESET | B(RESET) | RESET | RESET | RESET | A(RESET) | RESET |
| High | B(RESET) | B(RESET) | B(RESET) | RESET | A(X) | RESET |
| Low | B(X) | B(RESET) | B(RESET) | B(RESET) | A(X) | A(X) |
| High | B(X) | B(X) | B(X) | B(RESET) | A(X + 1) | A(X) |
| Low | B(X + 1) | B(X) | B(X) | B(X) | A(X + 1) | A(X + 1) |
| High | B(X + 1) | B(X + 1) | B(X + 1) | B(X) | A(X + 2) | A(X + 1) |
| Low | B(X + 2) | B(X + 1) | B(X + 1) | B(X + 1) | A(X + 2) | A(X + 2) |
| High | B(X + 2) | B(X + 2) | B(X + 2) | B(X + 1) | A(X + 3) | A(X + 2) |
| Low | B(X + 3) | B(X + 2) | B(X + 2) | B(X + 2) | A(X + 3) | A(X + 3) | count value CNT<3:0>. The count value CNT'<3:0> held by the first latch circuitry 36 is evaluated by the first logic stage 32. Particularly, an inverter 40 evaluates a first bit CNT'<0> of the captured count value. A two-input NAND gate 42 evaluates the first bit and a second bit CNT'<1> of the captured count value. A three-input NAND gate 44 evaluates the first bit, second bit and a third bit CNT'<2> of the captured count value. The inverter 40 and NAND gates 42, 44 of the first stage 32 indicate to the second logic stage 34 which count bits should change state during a second portion of the current clock cycle.

The second logic stage 34 increments the current count value based on the partially determined count value NCNT<2:0> provided by the first logic stage 32 and the count value CNT'<3:0> held by the first latch circuitry 36. Inverters 46 included in the first logic stage 32 invert the count value CNT'<3:0> held by the first latch circuitry 36. During the second portion of the clock cycle, latches 48 included in second latch circuitry 50 capture the inverted count value during a second portion of the clock cycle. The inverted count value CNT"<3:0> held by the second latch circuitry 50 is then provided to the second logic stage 34. Also, latches 52 included in third latch circuitry 54 capture the partially determined count value NCNT<2:0> and provide it to the second logic stage 34. The second logic stage 34 increments the current count value CNT<3:0> based on the state information provided by the second and third latch circuitry 50, 54.

The first bit of the count value CNT<0> output by the second logic stage 34 corresponds to the first latch output CNT"<0> of the second latch circuitry 50. A first set 56 of two pass gates 58, 60 and two inverters 62, 64 determine the second bit of the count value CNT<1> based on the second latch output CNT"<1> of the second latch circuitry 50 and the first bit NCNT<0> of the partially-determined count value. A second set 66 of two pass gates 68, 70 and two inverters 72, 74 determine the third bit of the count value CNT<2> based on the third latch output CNT"<2> of the second latch circuitry 50 and the second bit NCNT<1> of the partially-determined count value. Finally, a third set 76 of two pass gates 78, 80 and two inverters 82, 84 determine the fourth bit of the count value CNT<3> based on the fourth latch output CNT"<3> of the second latch circuitry 50 and the third bit NCNT<2> of the partially-determined count value. The second logic stage 34 also includes an inverter 86 for providing the reset signal to the second and third latch circuitry 50, 54 of the counter 30.

Operation of the four-bit counter 30 is described next with reference to Table 2 below. The counter 30 is set to an initial state responsive to an active reset signal (RESET). In the present example, the initial count value is CNT<3:0>=<0000>. However, the counter 30 may be reset to any desirable value. Regardless, the first latch circuitry 36 (Latch A in Table 2) captures the initial count value during a first portion of the clock cycle following reset. The first logic stage 32 inverts the captured count value and provides an inverted count value of <1111> to the input of the second latch circuitry 50 (Latch B in Table 2). The first logic stage 32 also evaluates the captured count value to determine whether certain ones of the count bits should change state during the current clock cycle. As part of this evaluation, the first logic stage 32 provides a partially-determined count value of <111> to the third latch circuitry 54 (Latch C in Table 1).

The second latch circuitry 50 captures the inverted count value of <1111> and the third latch circuitry 54 captures the partial next count value of <111> during a second portion of the current clock cycle. The second logic stage 34 determines the next state of the count value based on the count information held in the second and third latch circuitry 50, 54. Particularly, the second logic stage 34 sets CNT<0>=1 based on the state of CNT"<0>. The second, third and fourth count bits CNT<1:3> output by the second logic stage 34 depend on both the previous count value captured by the first latch circuitry 36 and the partial count value determined by the first logic stage 32.

The first set 56 of pass gates 58, 60 and inverters 62, 64 included in the second logic stage 34 determine the second bit CNT<1> of the count value based on the second latch output CNT"<1> of the second latch circuitry 50 and the first latch output NCNT<0> of the third latch circuitry 54. Because the first latch output NCNT<0> of the third latch circuitry 54 is '1', the first inverter 62 in the first set 56 of pass gates 58, 60 and inverters 62, 64 deactivates the first pass gate 58 and activates the second pass gate 60. The second inverter 64 in the first set 56 inverts the second latch output CNT"<1> of the second latch circuitry 50. Thus, the first set 56 of pass gates 58, 60 and inverters 62, 64 outputs CNT<1>=0 during the first clock cycle post reset. The second and third sets 66, 76 of pass gates 68, 70, 78, 80 and inverters 72, 74, 82, 84 likewise output CNT<2>=0 and CNT<3>=0, respectively. Thus, at the end of the first clock cycle after reset, the count value CNT<3:0> output by the second logic stage 34 is <0001>.

The count value output by the second logic stage 34 is captured by the first latch circuitry 36 and evaluated by the first logic stage 32 during successive clock cycles. The determination as to which pass gates 58, 60, 68, 70, 78, 80 in the second logic stage 34 are activated and which ones are not is made by the first logic stage 32 early in each clock cycle, thus improving counter performance. When the current count value reaches <1111>, the count value wraps to its initial value of <0000> during the following clock cycle. That is, the first latch circuitry 36 captures <1111> during a first portion of the clock cycle. The captured count value is inverted and provided to the second latch circuitry 50. The first logic stage 32 partially determines the next count value NCNT<2:0> during the first portion of the clock cycle. In this example, the first logic stage 32 outputs a value of <000> to the third latch circuitry 54 based on a captured count value of <1111>. The second latch circuitry 50 provides an inverted count value CNT"<3:0> of <0000> to the second logic stage 34 during a second portion of the current clock cycle. Likewise, the third latch circuitry 54 provides a partial count value NCNT<2:0> of <000> to the second logic stage 34. In response, the second logic stage 34 resets the count value to CNT<3:0>=<0000>.

TABLE 2

Multi-Stage Four-Bit Digital Counter State Transitions

| Clock State | Latch A In | Latch A Out | Latch B In | Latch B Out | Latch C In | Latch C Out |
|---|---|---|---|---|---|---|
| RESET | <0000> | <1111> | <0000> | <0000> | <000> | <000> |
| High | <0000> | <0000> | <1111> | <0000> | <111> | <000> |
| Low | <0001> | <0000> | <1111> | <1111> | <111> | <111> |

TABLE 2-continued

Multi-Stage Four-Bit Digital Counter State Transitions

| Clock State | Latch A In | Latch A Out | Latch B In | Latch B Out | Latch C In | Latch C Out |
|---|---|---|---|---|---|---|
| High | <0001> | <0001> | <1110> | <1111> | <110> | <111> |
| Low  | <0010> | <0001> | <1110> | <1110> | <110> | <110> |
| High | <0010> | <0010> | <1101> | <1110> | <111> | <110> |
| Low  | <0011> | <0010> | <1101> | <1101> | <111> | <111> |
| . | . | . | . | . | . | . |
| . | . | . | . | . | . | . |
| . | . | . | . | . | . | . |
| High | <1110> | <1110> | <0001> | <0010> | <111> | <110> |
| Low  | <1111> | <1110> | <0001> | <0001> | <111> | <111> |
| High | <1111> | <1111> | <0000> | <0001> | <000> | <111> |
| Low  | <0000> | <1111> | <0000> | <0000> | <000> | <000> |

Figure 6:
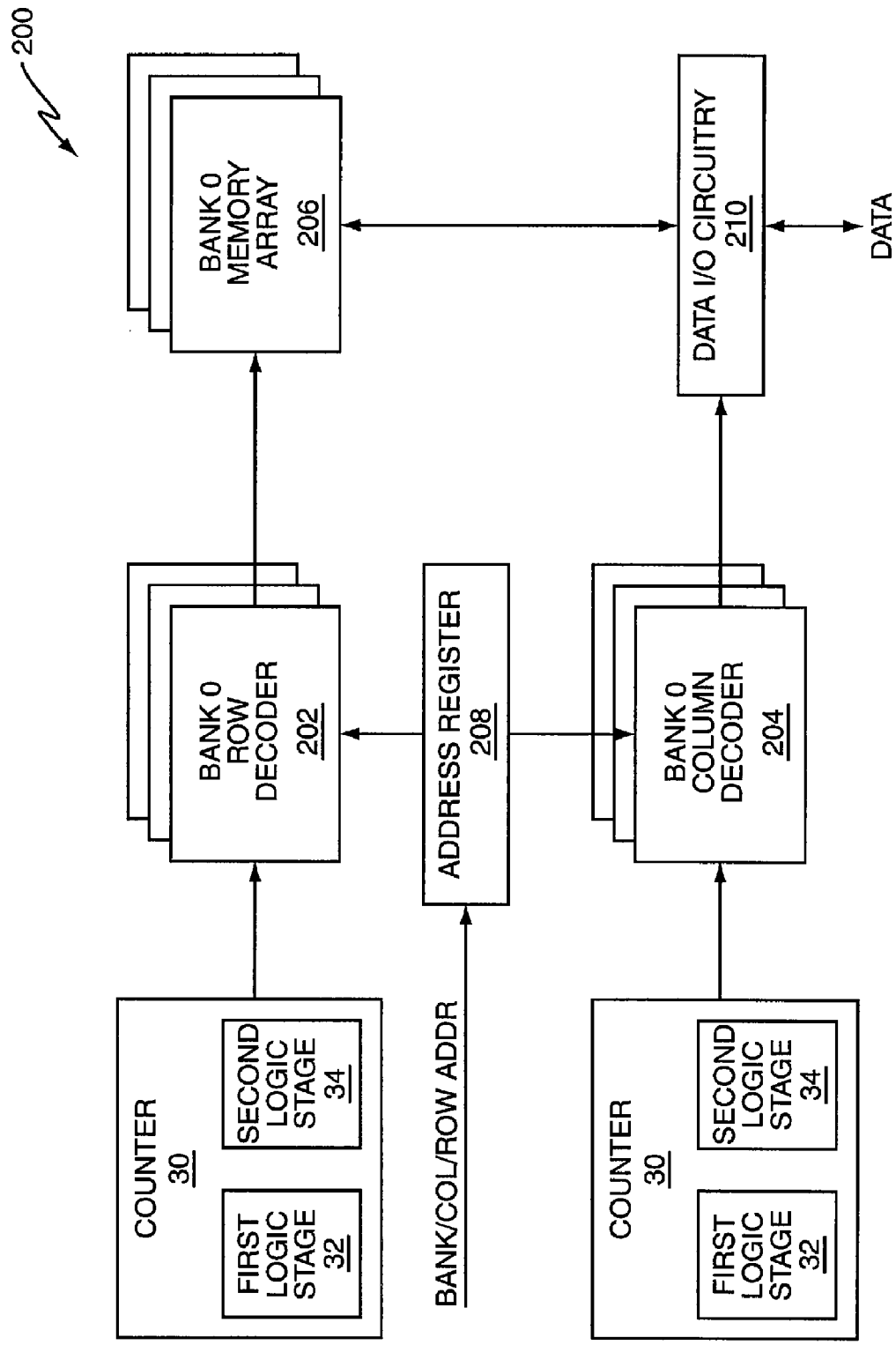
FIG. 6 is a block diagram of a embodiment of a memory device including the multi-stage clocked logic circuit of FIG. 5.

The clocked logic circuit embodiments disclosed herein may be included in any type of integrated circuit such as a microprocessor, application-specific integrated circuit, memory device, digital signal processor, controller or the like. FIG. 6 illustrates one embodiment of a memory device 200 such as a DRAM device including the counter 30 illustrated in FIG. 5. According to this embodiment, the counter 30 is included in or associated with row and column decoders 202, 204 included in the memory device 200 for addressing specific locations within an array 206 of memory cells.

The memory array 206 is arranged as one or more separately addressable banks of memory cells. A particular location within the array 206 is accessible by selecting the corresponding row, column and bank (if multiple banks are provided as shown in FIG. 6). Bank (BANK ADDR), row (ROW ADDR) and column (COL ADDR) addresses received by the memory device 200 are stored in an address register 208. The row decoder 202 selects a particular row within the array 206 based on the bank address and row address provided by the address register 208. Likewise, the column decoder 204 selects a particular column within the array 206 based on column address. The row and address decoders 202, 204 select locations within the array 206 by incrementing their respective counters 30 as is well known in the art. However, counter performance is improved according to this embodiment because each counter 30 is segmented into first and second logic stages 32, 34 as previously described herein. As such, timing-critical processing is performed early in each clock cycle by the first logic stages 32 while the second logic stages 34 complete the processing toward the end of the clock cycle. The length of the count value generated by each of the counters 30 depends on the number of addressable rows and columns, respectively, included in the memory array 206. Regardless, data Input/Output (I/O) circuitry 210 controls the flow of data into and out of the array 206 and may include masking logic, gating logic, write drivers, sense amplifiers, latches, data path, etc.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of reducing delay in a clocked logic circuit, comprising:

partially determining a next state of the clocked logic circuit based on a current state of the clocked logic circuit during a first portion of a clock cycle;

preventing the partially determined next state of the clocked logic circuit from affecting the current state of the clocked logic circuit during the first portion of the clock cycle;

completely determining the next state of the clocked logic circuit based on a previous state of the clocked logic circuit and the partially determined next state of the clocked logic circuit during a second portion of the clock cycle; and preventing the next state of the clocked logic circuit from affecting the partially determined next state of the clocked logic circuit during the second portion of the clock cycle.

2. The method of claim 1, wherein partially determining the next state of the clocked logic circuit comprises partially determining a count value.

3. The method of claim 2, wherein completely determining the next state of the clocked logic circuit comprises completely determining the count value based on a previously captured count value and the partially determined count value.

4. The method of claim 1, wherein partially determining the next state of the clocked logic circuit comprises generating timing-critical state information.

5. The method of claim 1, further comprising resetting the current state of the clocked logic circuit and the partially calculated next state of the clocked logic circuit responsive to a reset signal.

6. A clocked logic circuit, comprising:

first logic circuitry configured to partially determine a next state of the clocked logic circuit based on a current state of the clocked logic circuit during a first portion of a clock cycle;

latch circuitry configured to prevent the partially determined next state of the clocked logic circuit from affecting the current state of the clocked logic circuit during the first portion of the clock cycle; and second logic circuitry configured to completely determine the next state of the clocked logic circuit based on a previous state of the clocked logic circuit and the partially determined next state of the clocked logic circuit during a second portion of the clock cycle, wherein the latch circuitry is further configured to prevent the second logic circuitry from affecting operation of the first logic circuitry during the second portion of the clock cycle.

7. The clocked logic circuit of claim 6, wherein the first logic circuitry is configured to partially determine a count value.

8. The clocked logic circuit of claim 7, wherein the second logic circuitry is configured to completely determine the count value based on a previously captured count value and the partially determined count value.

9. The clocked logic circuit of claim 6, wherein the first logic circuitry is configured to generate timing-critical state information.

10. The clocked logic circuit of claim 6, wherein the latch circuitry is further configured to reset responsive to a reset signal.

11. An integrated circuit including the clocked logic circuit as claimed in claim 6.

12. A method of reducing delay in a clocked logic circuit segmented into at least first and second stages, comprising:
 during a first portion of a clock cycle:
  partially determining a next state of the clocked logic circuit by the first stage based on a captured state of the clocked logic circuit; and
  preventing the first stage from altering operation of the second stage; and
 during a second portion of the clock cycle:
  completely determining the next state of the clocked logic circuit by the second stage based on the captured state of the clocked logic circuit and the partially determined next state of the clocked logic circuit; and
  preventing the second stage from altering operation of the first stage.

13. The method of claim 12, wherein partially determining the next state of the clocked logic circuit comprises partially determining a count value.

14. The method of claim 13, wherein completely determining the next state of the clocked logic circuit comprises completely determining the count value based on a previously captured count value and the partially determined count value.

15. The method of claim 12, wherein partially determining the next state of the clocked logic circuit comprises generating timing-critical state information.

16. The method of claim 12, further comprising resetting the first and second stages responsive to a reset signal.

17. A clocked logic circuit, comprising:
 first and second logic stages; and
 latch circuitry configured to:
  capture a current state of the clocked logic circuit during a first portion of a clock cycle;
  provide the captured state of the clocked logic circuit to the first logic stage, the first logic stage configured to partially determine a next state of the clocked logic circuit based on the captured state of the clocked logic circuit;
  provide the captured state of the clocked logic circuit and the partially determined next state of the clocked logic circuit to the second logic stage during a second portion of the clock cycle, the second logic stage configured to completely determine the next state of the clocked logic circuit based on the captured state of the clocked logic circuit and the partially determined next state of the clocked logic circuit;
  prevent the second logic stage from altering operation of the first logic stage during the second portion of the clock cycle; and
  prevent the first logic stage from altering operation of the second logic stage during the first portion of the clock cycle.

18. The clocked logic circuit of claim 17, wherein the first logic stage is configured to partially determine a count value based on the captured state of the clocked logic circuit.

19. The clocked logic circuit of claim 18, wherein the second logic stage is configured to completely determine the count value based on a previously captured count value and the partially determined count value.

20. The clocked logic circuit of claim 17, wherein the first logic stage is configured to generate timing-critical state information.

21. The clocked logic circuit of claim 17, wherein the latch circuitry is further configured to reset responsive to a reset signal.

22. An integrated circuit including the clocked logic circuit as claimed in claim 17.

* * * * *